United States Patent [19]

Strahl

[11] Patent Number: 4,818,561
[45] Date of Patent: * Apr. 4, 1989

[54] THIN FILM DEPOSITION APPARATUS AND METHOD

[75] Inventor: Thomas L. Strahl, Fremont, Calif.

[73] Assignee: Machine Technology, Inc., Parsippany, N.J.

[ * ] Notice: The portion of the term of this patent subsequent to May 12, 2004 has been disclaimed.

[21] Appl. No.: 47,200

[22] Filed: May 6, 1987

Related U.S. Application Data

[63] Continuation of Ser. No. 779,537, Sep. 24, 1985, Pat. No. 4,664,935.

[51] Int. Cl.⁴ .................. B05D 3/06; C23C 16/00; C23C 14/00
[52] U.S. Cl. .................. 427/38; 427/255.5; 118/730; 204/192.1; 204/298
[58] Field of Search .............. 427/38, 255.5; 118/730; 204/192.1, 298

Primary Examiner—Norman Morgenstern
Assistant Examiner—Marianne L. Padgett
Attorney, Agent, or Firm—Lerner, David, Littenberg, Krumholz & Mentlik

[57] ABSTRACT

Apparatus and method for the deposition of a thin metal film on a surface of a workpiece as the workpiece is positioned adjacent to a deposition source and as the workpiece and deposition source rotate relative to each other about a first axis. The workpiece can also be moved relative to the deposition source about a second axis as the workpiece and the deposition source rotate relative to each other about the first axis. The distance between the workpiece and the deposition source can be adjusted.

33 Claims, 1 Drawing Sheet

THIN FILM DEPOSITION APPARATUS AND METHOD

This is a continuation of application Ser. No. 779,537, filed Sept. 24, 1985 now U.S. Pat. No. 4,664,935.

This invention relates to improvements in the coating of workpieces and, more particularly, to apparatus and a method for the deposition of thin metallic films on workpieces, such as semiconductor wafers.

BACKGROUND OF THE INVENTION

In general, three problems exist in connection with the deposition of thin films on surfaces. These problems are uniformity of film thickness, step coverage of the film over severe geometrical structures on the surfaces, and control of film morphology. When an adatom arrives at the surface of a growing film, it does not necessarily remain at its original point of impact but may migrate for a considerable distance depending upon the surface structure and the nature of the growing film, the temperature of the growing film, and the angle of incidence of the adatom.

Deposition from a spatially distributed deposition source gives a family of arrival angles at the surface to be coated which depends upon the geometry of the eroding target, the geometry of the features of the surface to be metallized, and the source to substrate orientation. In prior art apparatus, the eroding target has a predetermined shape. Typically, it is an inverse conic with a cone angle of the order of 30°. In such a case, the spatial distribution of the deposited material is fixed throughout the deposition cycle.

As is well known in the prior art relating to planetary tooling, the representation of angled arrival by serial cyclic distribution of these angles with the same weighting factor is not the same as those angles represented in distribution all at the same time. This is due to the generation of self-shadowing structures on the growing film near topographically severe structures, such as near unity aspect ratio channels and contact windows. As a result of self-shadowing, the film is not properly deposited in such channels or windows.

To eliminate the self-shadowing or step coverage problem with thin films, heat and bias have been used in the past to increase the mobility of the adatoms. Since angles are represented all at the same time, the problem is severe and a large heating time is needed to gain acceptable step coverage. Unfortunately for this approach, the same mechanism which allows heat to solve the step coverage problem causes large grain sizes and considerable variation in grain size. These faults in film morphology are most troublesome regarding pattern delineation and electromigration. Similarly, RF bias is often required to provide adequate enhancement of step coverage and this presents severe problems, namely reduced deposition rate, grain size variations and contamination of the growing film by material deposited by the system side walls.

Because of the step coverage problems associated with conventional deposition techniques used with workpieces, such as semiconductor wafers, a need exists for improvements in the apparatus and the method of coating workpieces. The present invention provides such improvements.

SUMMARY OF THE INVENTION

In the present invention, an apparatus and method are provided to effect the coating of a thin film of material on the face of a workpiece, which may be, among other things, a semiconductor wafer. The deposition source and the workpiece are located within a process chamber which can operate at a specific positive or negative pressure. The deposition source has an emitting surface oriented at an angle relative to the thin film receiving surface of the workpiece to satisfy the reduction or substantial elimination of self-shadowing. Such angle can be in the range of 10° to 45°.

To effect the reduction and elimination of the self-shadowing, the workpiece and deposition source are rotated relative to each other. Specifically, the deposition source is stationary and the workpiece is rotated. The workpiece can be rotated or rocked about a second axis extending longitudinally of the translational path of the deposition source.

A DC bias can be applied to the workpiece to provide the necessary increase in surface mobility along with a mild heating of the process chamber in which the deposition source and the workpiece are placed. At the optimum angle orientation, the bias and heating time required to attain step coverage are minimized. The specific values of angle, bias and heating time depend upon the structure of the surface features of the wafer itself. For example, for a one micron Al/Si (1%) film upon an 8800 A° high, one micron wide channel with 80° to 90° walls, the optimum conditions are: an angle of approximately 30°, a DC bias of about −175 volts, and a temperature equal to the ambient temperature plus the temperature due to heating to the heat of condensation of the arriving material.

The present invention provides a number of advantages including the high uniformity of coating of a thin film layer on a semiconductor wafer which is better than ±4% or better across a wafer whose diameter can be 100 mm, 125 mm, 150 mm, or 200 mm. Moreover, small grain aluminum/1% silicon film can be deposited without heat. The apparatus provides for vertical (sideways) deposition of a thin film for minimum particulate generation during deposition. A DC bias of up to −200 volts may be applied to the workpiece during deposition to control step coverage and grain size. Bias value ranges are specified for each geometry of the workpiece and set of deposition conditions. Pre-heating of the workpiece can be achieved to optimize the step coverage at the expense of grain size or simply to outgas the workpiece. An RF sputter etch can be provided for the removal of native oxide prior to deposition.

The primary object of the present invention is to provide an improved apparatus and method for depositing of a thin film on a workpiece, wherein the deposited film is uniformly thick, the deposition provides step coverage over severe geometrical structures on the workpiece, and the morphology of the film is effectively controlled to thereby avoid the problems associated with these factors when a conventional apparatus and method are used for the deposition of such films on a workpiece.

Another object of the present invention is to provide an apparatus and method of the type described wherein a workpiece to be provided with a thin film is mounted adjacent to a deposition source and the source and workpiece are rotated relative to each other as the surfaces of the source and workpiece are at an angle relative to each other to provide for step coverage over geometrical structures on the face of the workpiece without having to heat the workpiece and thereby eliminate the problem of grain size which is normally associated with conventional techniques.

Other objects of this invention will become apparent as the following specification progresses, reference being had to the accompanying drawings for an illustration of several embodiments of the invention.

IN THE DRAWINGS

Figure 1:
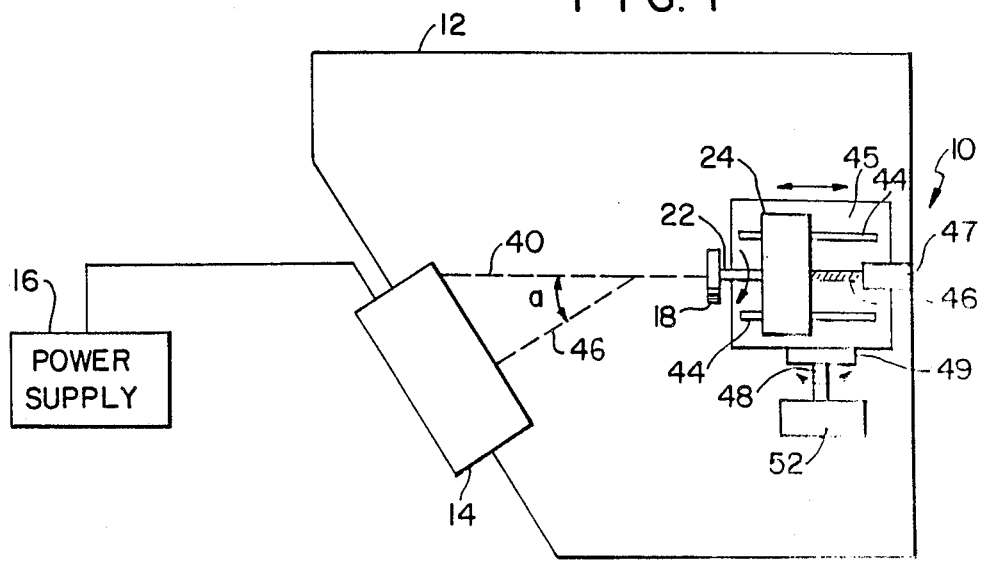
FIG. 1 is a schematic top view of the apparatus of the present invention, showing a workpiece in position to be coated by a deposition source.

The apparatus for applying a thin film layer to a surface of a workpiece is broadly denoted by the numeral 10 and is shown schematically in FIG. 1. Apparatus 10 includes a housing 12 having a thin film deposition source 14 provided with a power supply 16 for applying a high voltage to the deposition source. A workpiece 18, such as a semiconductor wafer which is generally circular in configuration, is mounted in some suitable manner on a central shaft 22 coupled to a rotatable drive means 24, whereby the shaft 22 and workpiece 18 can rotate relative to deposition source 14. Thus, when voltage is applied across the deposition source 14, and as drive means 24 is energized to rotate workpiece 18 about the central axis of shaft 22, deposition of a thin film layer of material on the exposed surface of workpiece 18 will occur and such layer will be uniformly applied to the workpiece.

Figure 2:
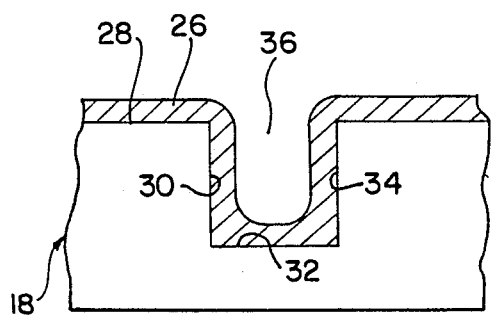
FIG. 2 is an enlarged, fragmentary cross-sectional view of a workpiece which has been coated with the apparatus of the present invention.

FIG. 2 illustrates how the resulting layer 26 of material is substantially uniformly thick on surfaces 30, 32 and 34 in a recess 36 formed in the workpiece to provide excellent step coverage. By orienting the deposition source and workpiece relative to each other at an angle a as shown in FIG. 1 and by at least rotating deposition source 14 and workpiece 18 relative to each other, the self-shadowing effect resulting from the use of prior art techniques is substantially reduced so as to be almost negligible as shown in FIG. 2. Angle a is the angle formed between an imaginary line 40 generally perpendicular to a thin film-receiving surface of the workpiece 18 and an imaginary line 46 which is generally perpendicular to the emission face/of deposition source 14, the latter typically being a planar sputter source.

Drive source 24 coupled with workpiece 18 can also be coupled to a pair of tracks 44 mounted on the upper surface of the platform 45 fixed in any suitable manner in housing 12. Tracks 44 allow workpiece 18 and drive means 24 to be moved toward and away from deposition source 14 along the direction of line 40. A lead screw 46 coupled to drive means 24 moves the drive means 24 and workpiece 18 when a reversible power drive 47 is actuated, power drive 47 being secured to housing 12.

Platform 45 has a side wall 49 coupled to a shaft 48, the shaft being coupled to a drive means 52, whereby the shaft 48 will rotate or rock drive means 24 back and forth in the direction of arrow 54 (FIG. 4), whereby the workpiece will traverse an arc which is in a vertical plane. This movement of the workpiece will provide for greater efficiency in step coverage and will provide for more uniformity in the coating of the workpiece.

Figure 4:
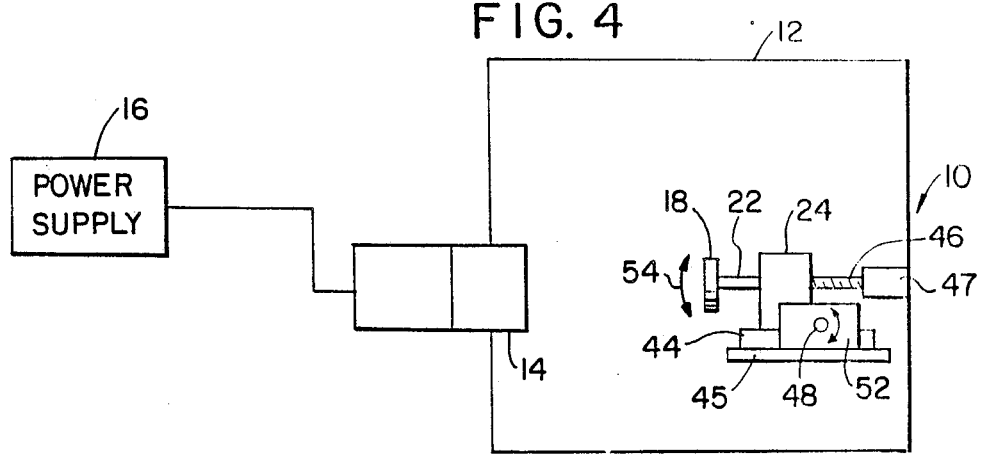
FIG. 4 is a schematic side view of the apparatus of FIG. 1.
Figure 3:
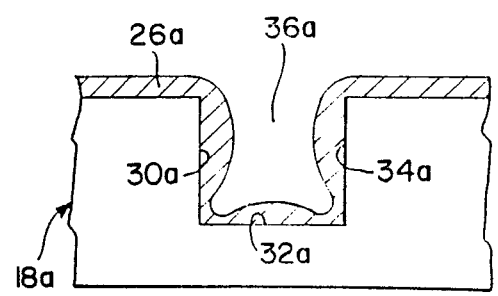
FIG. 3 is a view similar to FIG. 2 but showing a workpiece coated by apparatus of the prior art.

In use, workpiece 18 is mounted on shaft 22 and source 14 is positioned in housing 12 in the manner shown in FIGS. 1 and 4. By appropriately rotating the workpiece relative to the deposition source, the deposition of a thin film can be applied to the workpiece to provide step coverage in the manner shown in FIG. 3. Simultaneously with such rotation, and if deemed desirable or necessary, drive means 24 can be rotated by the actuation of drive means 52 about the central axis of shaft 48. Furthermore, during this deposition step, workpiece 18 can be moved toward and away from deposition source 14 by actuating power drive 47 to rotate lead screw 46. A rack and pinion assembly could be used in place of the lead screw if desired. All of the foregoing degrees of freedom provide for efficient deposition of a thin film on the workpiece by deposition source 14.

I claim:

1. Apparatus for applying a thin film by sputtering to a film-receiving surface of a workpiece comprising:
   means defining a process chamber;
   means for maintaining said process chamber at a pressure below atmospheric pressure;
   a deposition source in the process chamber at a first location therein, said deposition source having an emission surface arranged in a vertical orientation;
   sputtering means for sputtering film forming material from said emission surface; and
   means at a second location in the process chamber for mounting a workpiece having a film-receiving surface arranged in a vertical orientation for rotation relative to the deposition source, the emission surface and said film-receiving surface being at an angle in the range of about 10 to 45 degrees, said angle defined between an imaginary line perpendicular to the emission surface of the deposition source and an imaginary line perpendicular to the film-receiving surface of the workpiece when the workpiece is mounted by said mounting means.

2. Apparatus as set forth in claim 1, wherein the angle is approximately 30 degrees.

3. Apparatus as set forth in claim 1, wherein the distance between the mounting means and the deposition source is adjustable.

4. Apparatus as set forth in claim 1, wherein the distance between the mounting means and the deposition source is adjustable as the workpiece rotates relative to the deposition source.

5. Apparatus as set forth in claim 1, wherein said mounting means has means for moving the workpiece toward and away from the deposition source along a predetermined path.

6. Apparatus as set forth in claim 5, wherein said path is rectilinear.

7. Apparatus as set forth in claim 1, wherein said workpiece mounting means includes a first shaft for rotatably mounting the workpiece at said second location, and including a drive means coupled with the shaft for rotating the same.

8. Apparatus as set forth in claim 7, wherein is included a second shaft coupled to said drive means for mounted the drive means for rotation about an axis generally perpendicular to the axis of the first shaft, and drive structure coupled with the second shaft for rotating the same relative to the deposition source.

9. The apparatus of claim 1, wherein said emission surface is arranged in an approximate vertical plane.

10. The apparatus of claim 1, wherein said film receiving surface is arranged in an approximate vertical plane.

11. The apparatus of claim 1, wherein said emission surface is arranged in a substantially vertical plane.

12. The apparatus of claim 1, wherein said film receiving surface is arranged in a substantially vertical plane.

13. A method for applying a thin film by sputtering to a film-receiving surface of a workpiece comprising:
providing a deposition source in a process chamber with the source having an emission surface arranged in a vertical orientation;
mounting a workpiece in the process chamber in space relationship to the deposition source, said workpiece having a film-receiving surface arranged in a vertical orientation;
maintaining the process chamber at a pressure below atmospheric pressure during sputtering;
energizing said deposition source for sputtering film forming material from said emission surface;
rotating said workpiece relative to the deposition source as the deposition source is energized; and
maintaining the emission surface and the film-receiving surface at an angle in the range of about 10 to 45 degrees, said angle defined between an imaginary line perpendicular to the emission surface of the deposition source and an imaginary line perpendicular to the film-receiving surface of the workpiece when the workpiece is mounted within the process chamber.

14. A method as set forth in claim 13, wherein the rotating step includes rotating the workpiece as the deposition source remains stationary.

15. A method as set forth in claim 13, wherein the angle is approximately 30 degrees.

16. A method as set forth in claim 13, wherein is included the step of adjusting the distance between the workpiece and the deposition source.

17. A method as set forth in claim 13, wherein is included the step of adjusting the distance between the workpiece and the deposition source as the workpiece rotates relative to the deposition source.

18. A method as set forth in claim 13, wherein is included the step of rotating the workpiece about a first axis relative to the deposition source, and rotating the workpiece about a second axis perpendicular to the first axis.

19. A method as set forth in claim 18, wherein said step of rotating the workpiece about the second axis includes rocking the workpiece back and forth about said second axis.

20. The method of claim 13, wherein said emission surface is arranged in an approximate vertical plane.

21. The method of claim 13, wherein said film receiving surface is arranged in an approximate vertical plane.

22. The method of claim 13, wherein said emission surface is arranged in a substantially vertical plane.

23. The method of claim 13, wherein said film receiving surface is arranged in a substantially vertical plane.

24. Apparatus for applying a thin film by sputtering to an irregular film-receiving surface of a workpiece to provide step coverage thereof, said apparatus comprising:
means defining a process chamber;
means for maintaining said process chamber at a pressure below atmospheric pressure;
a deposition source in the process chamber at a first location therein, said source having an emission surface arranged in a vertical orientation;
sputtering means for sputtering film forming material from said emission surface; and
means at a second location in the process chamber for mounting a workpiece having an irregular film-receiving surface arranged in a vertical orientation for rotation relative to the deposition source, the emission surface and said film-receiving surface being at an angle in the range of about 10 to 45 degrees, said angle defined between an imaginary line perpendicular to the emission surface of the deposition source and an imaginary line perpendicular to the film-receiving surface of the workpiece when the workpiece is mounted by said mounting means, whereby step coverage of said irregular film-receiving surface by said film forming material is enhanced.

25. The apparatus of claim 24, wherein said emission surface is arranged in an approximate vertical plane.

26. The apparatus of claim 24, wherein said film receiving surface is arranged in an approximate vertical plane.

27. The apparatus of claim 24, wherein said emission surface is arranged in a substantially vertical plane.

28. The apparatus of claim 24, wherein said film receiving surface is arranged in a substantially vertical plane.

29. A method for applying a thin film by sputtering to an irregular film-receiving surface of a workpiece to provide step coverage thereof, said method comprising the steps of:
providing a deposition source in a process chamber with the source having an emission surface arranged in a vertical orientation;
mounting a workpiece in the process chamber in spaced relationship to the deposition source, said workpiece having an irregular film-receiving surface arranged in a vertical orientation;
maintaining the process chamber at a pressure below atmospheric pressure during sputtering;
energizing said deposition source for sputtering film forming material from said emission surface;
rotating said workpiece relative to the deposition source as the deposition source is energized; and
maintaining the emission surface and the film-receiving surface at an angle in the range of about 10 to 45 degrees, said angle defined between an imaginary line perpendicular to the emission surface of the deposition source and an imaginary line perpendicular to the film-receiving surface of the workpiece when the workpiece is mounted within the process chamber, whereby step coverage of said irregular film-receiving surface by said film forming material is enhanced.

30. The method of claim 29, wherein said emission surface is arranged in an approximate vertical plane.

31. The method of claim 29, wherein said film receiving surface is arranged in an approximate vertical plane.

32. The method of claim 29, wherein said emission surface is arranged in a substantially vertical plane.

33. The method of claim 29, wherein said film receiving surface is arranged in a substantially vertical plane.

* * * * *